US006697051B2

(12) United States Patent
Lee

(10) Patent No.: US 6,697,051 B2
(45) Date of Patent: Feb. 24, 2004

(54) ELECTRONIC DEVICE WITH DECORATIVE SEALED VESSEL

(76) Inventor: Vincent K. Lee, 4F, No., 48, Lane 10, Chi Fu Rd., Taipei 114 (TW)

( * ) Notice: Subject to any disclaimer, the term of this patent is extended or adjusted under 35 U.S.C. 154(b) by 0 days.

(21) Appl. No.: 10/334,781

(22) Filed: Jan. 2, 2003

(65) Prior Publication Data

US 2003/0098846 A1 May 29, 2003

Related U.S. Application Data

(63) Continuation-in-part of application No. 09/640,190, filed on Aug. 17, 2000.

(30) Foreign Application Priority Data

Nov. 19, 2002 (CN) ....................................... 02286118 U

(51) Int. Cl.[7] .................................................. G09G 5/08

(52) U.S. Cl. ....................... 345/163; 345/168; 345/156; 345/158; 345/161; 40/409

(58) Field of Search ................................ 345/163, 168, 345/156, 158, 161; 40/409

(56) References Cited

U.S. PATENT DOCUMENTS

| | | | |
|---|---|---|---|
| 6,066,021 A | 5/2000 | Lee | |
| 6,155,411 A | 12/2000 | Ho | |
| 6,195,085 B1 | 2/2001 | Becker et al. | |
| 6,282,820 B1 * | 9/2001 | White et al. | 40/410 |
| 6,380,926 B1 | 4/2002 | Ho | |

* cited by examiner

*Primary Examiner*—Matthew C. Bella
*Assistant Examiner*—Tam Tran
(74) *Attorney, Agent, or Firm*—Bacon & Thomas, PLLC

(57) ABSTRACT

An electronic device. A decorative sealed vessel is coupled to the electronic device. The decorative sealed vessel has at least one liquid and a decorative and magnetic structure. The electronic device has a power connection interface used to connect with a computing device for receiving electrical power from the computing device. The electronic device further includes a magnetic generating device for generating a varying magnetic field. The magnetic generating device is positioned around the decorative sealed vessel, so that the varying magnetic field can make the decorative and magnetic structure move.

11 Claims, 5 Drawing Sheets

90
10, 51
16
11
30
32
31

ELECTRONIC DEVICE WITH DECORATIVE SEALED VESSEL

RELATED APPLICATIONS

This application is a Continuation-in-Part application of U.S. Ser. No. 09/640,190, filed Aug. 17, 2000.

BACKGROUND OF THE INVENTION

1. Field of the Invention

The present invention relates to an electronic device, and more particularly to a computer device accessory having a decorative sealed vessel.

2. Description of the Related Art

Several patents have been granted regarding the combination of a decorative sealed vessel with other objects to provide a decorative effect. For example, U.S. Pat. No. 6,380,926 discloses many exemplar embodiments.

In U.S. Pat. No. 6,380,926 there is shown an embodiment that is a mouse with a decorative sealed vessel, which is beneficial as this makes the mouse more attractive. The decorative sealed vessel usually contains a decorative structure (e.g. a duck, puppy, company logo, etc.), and the design of the decorative structure is the major feature that provides the attractiveness of the product.

The decorative structure is usually stationary, unless a user shakes the decorative sealed vessel, which imparts a corresponding shaking of the decorative structure. Only when the decorative structure is shaking does the decorative sealed vessel fully show its funny and attractive effects.

The decorative structure as disclosed in U.S. Pat. No. 6,380,926 concerns this above-mentioned shaking when a user is using the mouse. However, the user's palm is in contact with the mouse so that the user cannot actually see the decorative structure. Furthermore, since the user's eye is staring at a screen when using the mouse, the user does not pay attention to the decorative structure. Therefore, although the mouse utilizes a decorative sealed vessel, the decorative sealed vessel, in fact, does not show to its best effect.

On the other hand, when the mouse disclosed in U.S. Pat. No. 6,380,926 is not being used, users generally do not shake the mouse since users are in contact with the mouse too often when actually using the mouse.

For other computer device accessories, such as hubs, memory card readers, or keypads, similar problems also exist. These computer device accessories have a cold and lifeless feel. If these computer device accessories are combined with decorative sealed vessels, and if the associated decorative structure can shake by itself, these computer device accessories will provide to the users a more enjoyable mien.

SUMMARY OF THE INVENTION

An object of the present invention is to provide a more attractive electronic device that has a decorative sealed vessel. In the present invention, the decorative structure inside the decorative sealed vessel can shake by itself without help from a user. Therefore, the decorative sealed vessel can fully show its funny and attractive effects. Thus, an electronic device will feel livelier.

Another object of the present invention is that no additional power is required to make the decorative structure shake. The shaking power is obtained from the original power provided by a computing device, which is connected to the electronic device.

To achieve these objects, the electronic device of the present invention includes a casing, an electric circuit mechanism, and a power connection interface, wherein the power connection interface is used to connect with a computing device for receiving electrical power from the computing device and provide electrical power for the electric circuit mechanism.

The electronic device further comprises a magnetic generating device that is connected with the electric circuit mechanism and that is able to receive the electrical power for generating a varying magnetic field. According to the embodiment, a magnetic generating device is an electromagnet, or a moveable magnet controlled by an electric motor.

A decorative sealed vessel is coupled to the electronic device. The decorative sealed vessel comprises at least one liquid, at least one decorative and magnetic structure.

The magnetic generating device is positioned around the decorative sealed vessel, so that the varying magnetic field can make the decorative and magnetic structure move.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
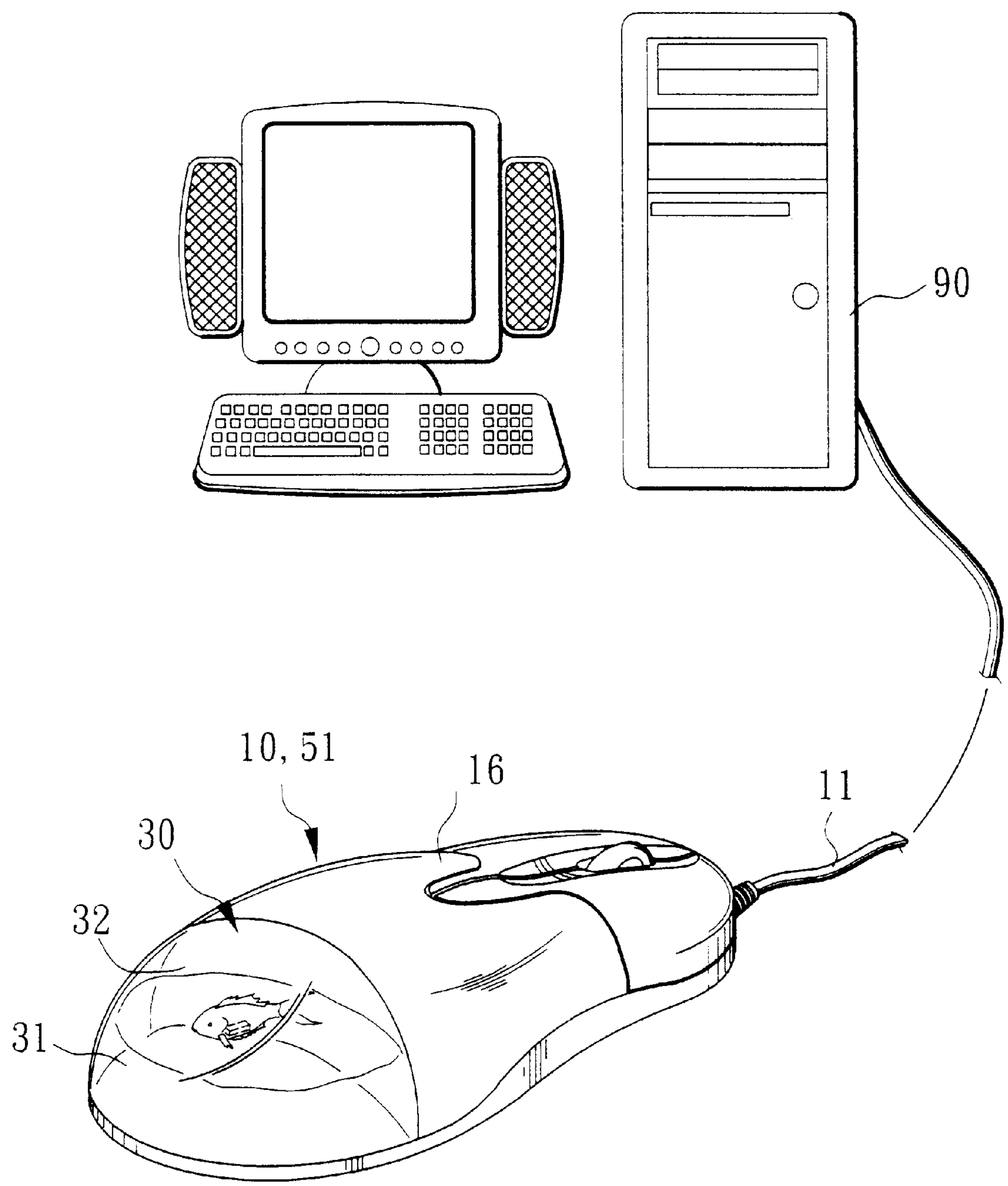
FIG. 1 shows a perspective view of a pointing device with a decorative sealed vessel according to a first embodiment of the present invention.
Figure 2:
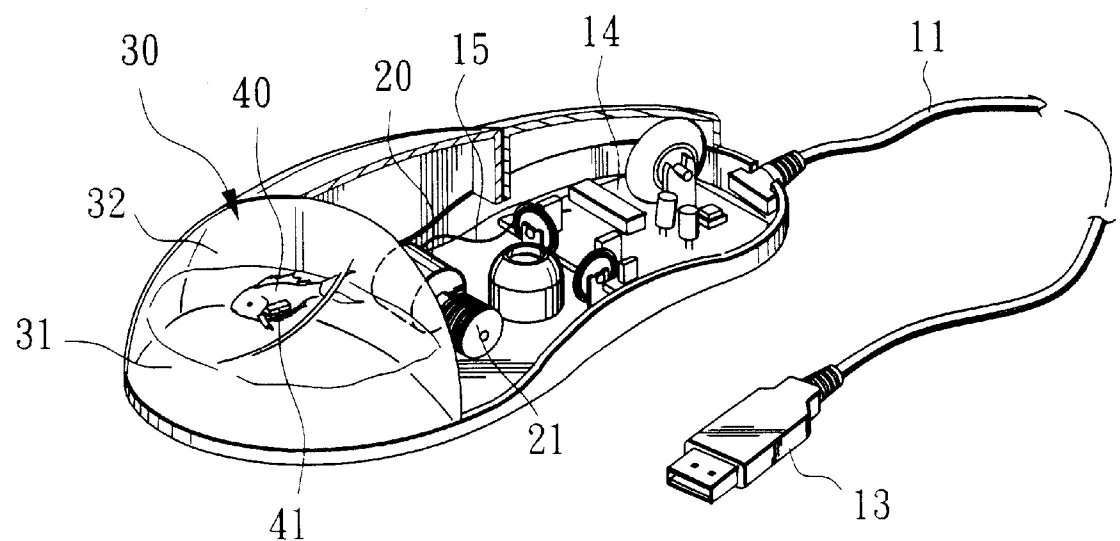
FIG. 2 shows a portion of an internal view of a pointing device with a decorative sealed vessel according to a first embodiment of the present invention.
Figure 3:
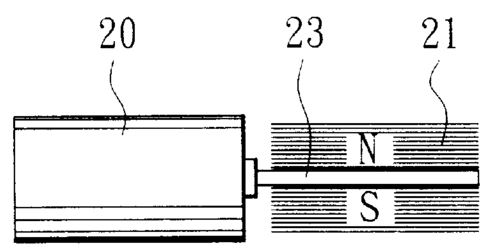
FIG. 3 shows a side view of an electric motor and a magnet connected therewith in accordance of the first embodiment.

Please refer to FIGS. 1~3 for the first embodiment of the present invention. According to the first embodiment, an electronic device 10 is a pointing device 51 (e.g. a mouse). Because the pointing device 51 is a well-known apparatus, the details of the pointing mechanism of the pointing device 51 is not within the field of the subject matter of the present invention, and so details of such a mechanism for the pointing device 51 are not explained hereafter. The pointing device 51 generally has a casing 16, an electric circuit mechanism 14 mounted inside of the casing 16, and a power connection interface 11. The power connection interface 11 shown in the FIGS. 1~2 is a wire supporting a USB interface 13. The power connection interface 11 connects the pointing device 51 with the computing device 90.

The function of the power connection interface 11 is to receive electrical power from a computing device 90 and provide electrical power for the electric circuit mechanism 14, which generates pointing signals. In addition, the power connection interface 11 also acts as a signal communication medium between the computing device 90 and the pointing device 51. The computing device 90 may be a personal computer, notebook, PDA, etc.

The subject matter of the present invention is that the electronic device 10 further comprises a decorative sealed vessel 30, and a mechanism that makes the decorative sealed vessel 30 more entertaining. The decorative sealed vessel 30 can be connected, attached, fused, or adhered to the electronic device 10, or be removably contained within, or be an integral part of, the electronic device 10. Because the manner of combining two simple objects together is well known to those of reasonable skill in the art, the detailed description for doing so is omitted.

The decorative sealed vessel 30 contains at least one liquid and a decorative structure 40. According to the embodiment, there are two liquids, a first liquid 31 and a second liquid 32. The decorative structure 40 is insoluble and floats on the first liquid 31 and the second liquid 32. The decorative sealed vessel 30 with one or more liquids, and at least one decorative structure 40, has been developed for years. Please refer to U.S. Pat. No. 6,380,926 and U.S. Pat. No. 6,066,021, which are included herein by reference, for more detailed descriptions for such a decorative sealed vessel. The special design for the decorative structure 40 of the present invention is that the decorative structure 40 further embeds a magnetic member 41. The magnetic member 41 can be a magnet or any magnetic material, such as metal.

Another characteristic of the present invention is that the electronic device 10 further comprises an electric motor 20. The electric motor 20 may be any device that transfers electrical power to mechanical power. For example, the electric motor 20 may be a common rotational-style motor, a motor for a clock, a solenoid, etc. The electric motor 20 receives electrical power through an electric wire 15. A magnet 21 is mounted on the shift 23 (which is a transferring means) of the electric motor 20. Thus, the electric motor 20 rotates the magnet 21 to generate a varying magnetic field. There are many different mechanism designs to move the magnet 21 in order to generate a varying magnetic field. The manner of moving the magnet 21 could be rotation as mentioned above, but could also be a back-and-forth movement, a vibrating movement, or another type of movement. The transferring means between the electric motor 20 and the magnet 21 may be the shift 23, but may also include gears, linkages, etc.

The magnet 21 is positioned around the decorative sealed vessel 30. Therefore when the magnet 21 moves, the magnetic member 41 will also move so that the decorative structure 40 will also move accordingly. Due to the characteristic of the varying magnetic field and the liquid, the decorative structure 40, in fact, will make unpredictable movements (shaking), and the first liquid 31 and the second liquid 32 will also shake accordingly.

The purpose of the present invention is to create an amusing or entertaining effect. As long as the pointing device 51 is on (i.e., provided electrical power), the decorative structure 40 will make unpredictable movements to produce an entertaining effect. Note that the primary purpose of the magnet 21 and the electric motor 20 is to act as a magnetic generating device for generating a varying magnetic field.

Figure 4:
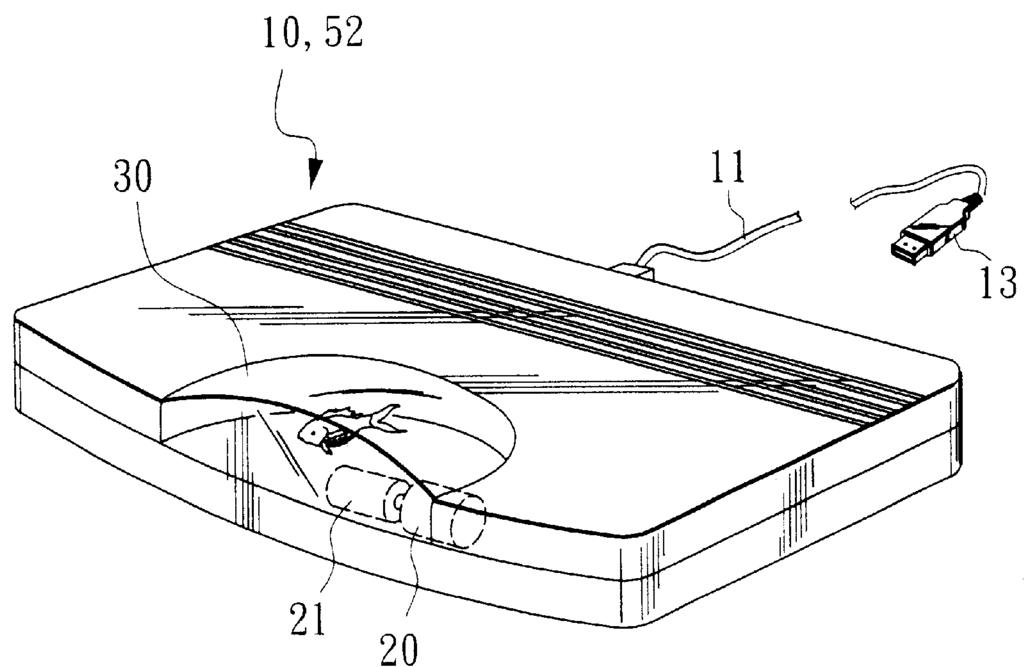
FIG. 4 shows a perspective view of a hub with a decorative sealed vessel according to a second embodiment of the present invention.

Please refer to FIG. 4 for a second embodiment of the present invention. According to the second embodiment, the electronic device is a hub 52. The subject matter of the second embodiment is the same as that of the first embodiment. The hub 52 also has a power connection interface 11 (e.g. a wire supporting a USB interface 13) in order to receive electrical power from a computing device (not shown in FIG. 4), and which also acts as a signal communication medium. Inside the hub 52, the hub 52 also has a magnet 21 and an electric motor 20 which are functionally the same as in the first embodiment. The hub 52 is therefore a network hub.

Figure 5:
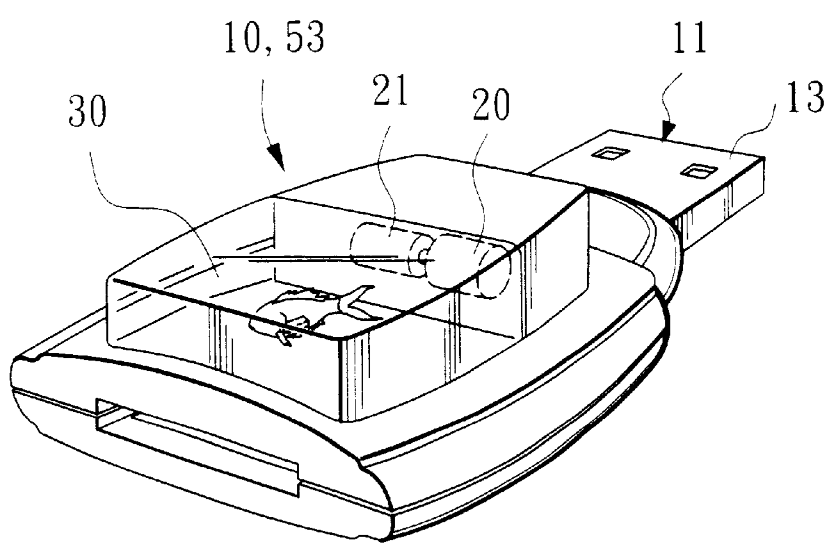
FIG. 5 shows a perspective view of a memory card reader with a decorative sealed vessel according to a third embodiment of the present invention.

Please refer to FIG. 5 for a third embodiment of the present invention. According to the third embodiment, the electronic device is a memory card reader 53. Similarly, the memory card reader 53 also has a power connection interface 11 (e.g. a wire supporting a USB interface 13), a magnet 21 and an electric motor 20.

Figure 6:
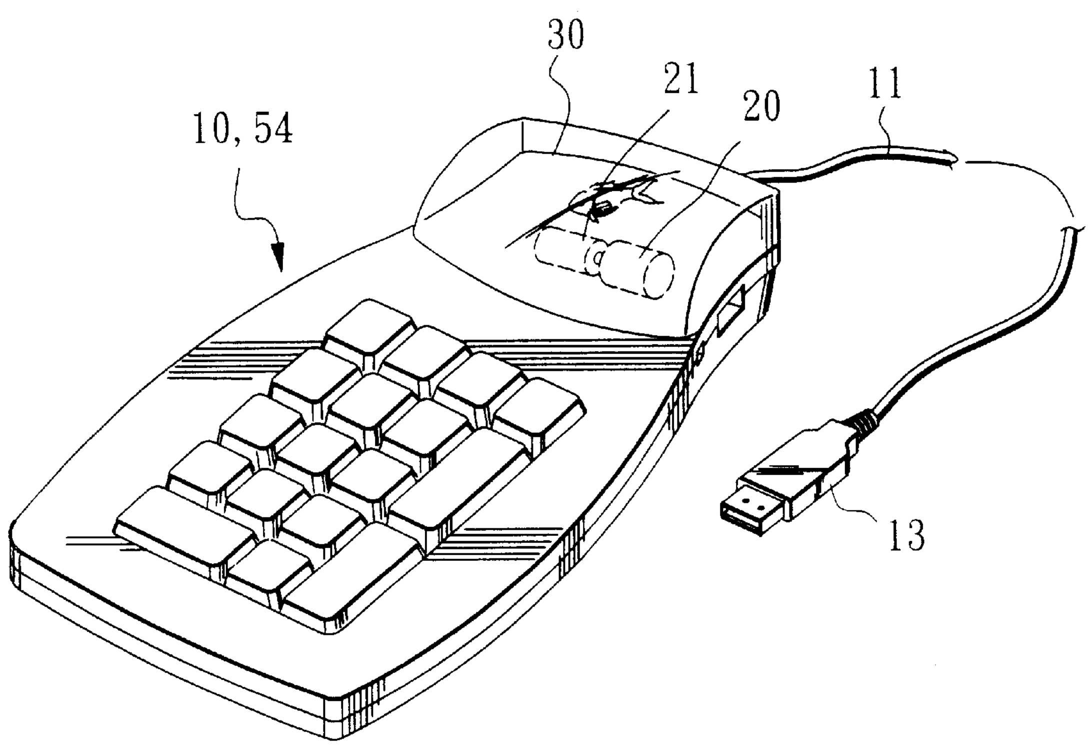
FIG. 6 shows a perspective view of a keypad with a decorative sealed vessel according to a fourth embodiment of the present invention.

Please refer to FIG. 6 for a fourth embodiment of the present invention. According to the fourth embodiment, the electronic device is a keypad 54. Similarly, the keypad 54 also has a power connection interface 11 (e.g. a USB interface 13), a magnet 21 and an electric motor 20.

Figure 7:
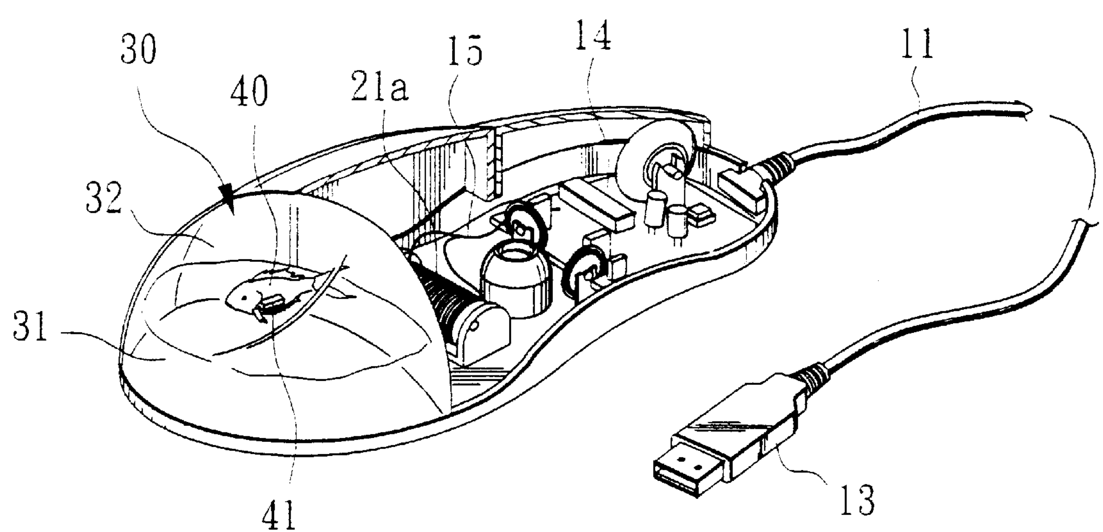
FIG. 7 shows a perspective view of a pointing device with a decorative sealed vessel according to a fifth embodiment of the present invention.

Please refer to FIG. 7 for a fifth embodiment of the present invention. The major difference of the fifth embodiment is the use of an electromagnet 20*a* instead of the magnet 21 and the electric motor 20 shown in the first embodiment. The electromagnet 21*a* is a standard electronic component, which can generate a magnetic field when an electric current is provided (i.e. when the electric current passes through a coil, an electromagnet's major element, a magnetic field is generated). Therefore, it is easy to make the electromagnet 21*a* generate a varying magnetic field by providing the electromagnet 21*a* with a correspondingly varying electric current. For example, by changing the amount of current, or the direction of current, a varying electric current can be produced. Providing the varying electric current can be accomplished very easily by using the electric circuit mechanism 14, for example, by using a common microchip (not shown). The manner used to provide the electromagnet 21*a* with a varying electric current should be well known to those reasonably skilled in the art, and so it is not necessary to discuss the details here. The electromagnet 21*a* is positioned around the decorative sealed vessel 30. Similar to the first embodiment, the magnetic member 41 will move so that the decorative structure 40 will also move accordingly.

Although the present invention has been explained in relation to its preferred embodiment, it is to be understood that many other possible modifications and variations can be made without departing from the spirit and scope of the invention as hereinafter claimed. For example, the electronic device 10 in the present invention could be any device that is connected with the computing device when the device 10 is on. Beyond a pointing device, a hub, a memory card reader, and a keypad mentioned in the embodiments above, other devices (e.g. computer device accessories) are also within the scope of the present invention, such as a monitor, a screen, a keyboard, a portable hard/soft disk, a joystick, a camera/camcorder for a computer, a scanner, a pen tablet, a microphone for a computer, an MP3 player, a computer speaker, etc. Please also note that the decorative structure 40 has a magnetic member 41 in the embodiments. However, the decorative structure 40 could also be a decorative and "magnetic" structure, and then the magnetic member 41 could be excluded, if the material used for the decorative structure 40 is a magnetic material.

What is claimed is:

1. An electronic device (10) with a decorative sealed vessel (30), the electronic device (10) having a casing (16), an electric circuit mechanism (14), and a power connection interface (11), wherein the power connection interface (11) is used to connect with a computing device 90 for receiving electrical power from the computing device (90) and provide the electrical power for the electric circuit mechanism (14), wherein the electronic device (10) is a pointing device (51) and further comprises:

a magnetic generating device connected with the electric circuit mechanism (14) and capable of receiving the electrical power for generating a varying magnetic field a decorative sealed vessel (30) coupled to the electronic device (10), comprising:

at least one liquid;

at least one decorative structure (40) having a magnetic member (41);

wherein the decorative structure (40) is insoluble in the liquid and floats on the liquid;

wherein the electric circuit mechanism (14) provides a varying electric current for the electromagnetic (20*a*), so that the electromagnetic (20*a*) generates a varying magnetic field;

wherein the electromagnet (20*a*) is positioned around the decorative sealed vessel (30); and whereby when the electromagnet (20*a*) generates a varying magnetic field, the magnetic member (41) moves so that the decorative structure (40) moves accordingly.

2. The electronic device (10) with decorative sealed vessel (30) as claimed in claim 1 wherein the magnetic generating device comprises:

a magnet (21);

an electric motor (20) to transfer the electrical power to mechanical power; and transferring means for transferring the mechanical power to the magnet (21) so that the magnet (21) moves to generate a varying magnetic field.

3. The electronic device (10) with decorative sealed vessel (30) as claimed in claim 2 wherein the transferring means is a shift (23).

4. The electronic device (10) with decorative sealed vessel (30) as claimed in claim 1 wherein the magnetic generating device is an electromagnetic (20*a*) that is capable of generating a magnetic field, and the electric circuit mechanism (14) is capable of providing a varying electric current for the electromagnet (20*a*) so that the electromagnet (20*a*) generates a varying magnetic field.

5. The electronic device (10) with decorative sealed vessel (30) as claimed in claim 1, wherein the decorative and magnetic structure (40) comprises at least a magnet (41).

6. The electronic device (10) with a decorative sealed vessel (30), the electronic device (10) having a casing (16), an electric circuit mechanism (14), and a power connection interface (11), wherein the power connection interface (11) is used to connect with a computing device (90) for receiving electrical power from the computing devide (90) and provide the electrical power for the electric circuit mechanism (14), wherein the electronic device (10) is a network hub (52) and further comprises:

a magnetic generating device connected with the electric circuit mechanism (14) and capable of receiving the electrical power for generating a varying magnetic field;

a decorative sealed vessel (30) coupled to the electronic device (10), comprising:

at least one liquid;

at least one decorative structure (40) having a magnetic member (41);

wherein the decorative structure (40) is insoluble in the liquid and floats on the liquid;

wherein the electric circuit mechanism (14) provides a varying electric current for the electromagnetic (20*a*), so that the electromagnet (20*a*) generates a varying magnetic field;

wherein the electromagnet (20*a*) is positioned around the decorative sealed vessel (30); and whereby when the electromagnet (20*a*) generates a varying magnetic field, the magnetic member (41) moves so that the decorative structure (40) moves accordingly.

7. The electronic device (10) with decorative sealed vessel (30) as claimed in claim 6, wherein the magnetic generating device comprises:

a magnet (21);

an electric motor (20) to transfer the electrical power to mechanical power; and transferring means for transferring the mechanical power to the magnet (21) so that the magnet (21) moves to generate a varying magnetic field.

8. An electronic device (10) with a decorative sealed vessel (30), the electronic device (10) having a casing (16), an electrical circuit mechanism (14), and a power connection interface (11), wherein the power connection interface (11) is used to connect with a computing device (90) for receiving electrical power from the computing device (90) and provide the electrical power for the electric circuit mechanism (14), wherein the electronic device (10) is a memory card reader (53) and further comprises:

a magnetic generating device connected with the electric circuit mechanism (14) and capable of receiving the electrical power for generating a varying magnetic field;

a decorative sealed vessel (30) coupled to the electronic device (10), comprising:

at least one liquid;

at least one decorative structure (40) having a magnetic member (41);

wherein the decorative structure (40) is insoluble in the liquid and floats on the liquid;

wherein the electric circuit mechanism (14) provides a varying electric current for the electromagnet (20*a*), so that the electromagnet (20*a*) generates a varying magnetic field;

wherein the electromagnet (20*a*) is positioned around the decorative sealed vessel 30; and whereby when the electromagnet (20*a*) generates a varying magnetic field, the magnetic member (41) moves to that the decorative structure (40) moves accordingly.

9. The electronic device (10) with decorative sealed vessel (30) as claimed in claim 8, wherein the magnetic generating device comprises:

a magnet (21);

an electric motor 20 to transfer the electrical power to mechanical power; and transferring means for transferring the mechanical power to the magnet (21) so that the magnet (21) moves to generate a varying magnetic field.

10. An electronic device (10) with a decorative sealed vessel (30), the electronic device (10) having a casing (16), an electric circuit mechanism (14), and a power connection interface (11), wherein the power connection interface (11) is used to connect with a computing device (90) for receiving electrical power from the computing device (90) and provide the electrical power for the electric circuit mechanism 14, wherein the electronic device (10) is a keypad (54) and further comprises:

a magnetic generating device connected with the electric circuit mechanism (14) and capable of receiving the electrical power for generating a varying magnetic field;

a decorative sealed vessel (30) coupled to the electronic device (10), comprising:

at least one liquid;

at least one decorative structure (40) having a magnetic member (41);

wherein the decorative structure (40) is insoluble in the liquid and floats on the liquid;

wherein the electric circuit mechanism (14) provides a varying electric current for the electromagnetic **(20*a*), so that the electromagnet (20*a*)** generates a varying magnetic field;

wherein the electromagnet **(20*a*) is positioned around the decorative sealed vessel (30); and whereby when the electromagnet (20*a*) generates a varying magnetic field, the magnetic member (41) moves so that the decorative structure (40)** moves accordingly.

11. The electronic device (10) with decorative sealed vessel (30) as claimed in claim 10 wherein the magnetic generating device comprises:

a magnet (21);

an electric motor (20) to transfer the electrical power to mechanical power; and transferring means for transferring the mechanical power to the magnet (21) so that the magnet (21) moves to generate a varying magnetic field.

* * * * *